United States Patent
Choi et al.

(10) Patent No.: US 12,005,724 B2
(45) Date of Patent: Jun. 11, 2024

(54) LEVELING UNIT FOR IMPRINTING AND IMPRINT APPARATUS COMPRISING SAME

(71) Applicant: Korea Institute of Machinery & Materials, Daejeon (KR)

(72) Inventors: Kee-Bong Choi, Daejeon (KR); Jae-Jong Lee, Daejeon (KR); Geehong Kim, Daejeon (KR); Hyungjun Lim, Daejeon (KR); Soongeun Kwon, Seongnam-si (KR); Junhyoung Ahn, Daejeon (KR)

(73) Assignee: KOREA INSTITUTE OF MACHINERY & MATERIALS, Daejeon (KR)

( * ) Notice: Subject to any disclaimer, the term of this patent is extended or adjusted under 35 U.S.C. 154(b) by 117 days.

(21) Appl. No.: 17/432,646

(22) PCT Filed: Jul. 20, 2020

(86) PCT No.: PCT/KR2020/009503
§ 371 (c)(1),
(2) Date: Aug. 20, 2021

(87) PCT Pub. No.: WO2021/015508
PCT Pub. Date: Jan. 28, 2021

(65) Prior Publication Data
US 2022/0161583 A1    May 26, 2022

(30) Foreign Application Priority Data
Jul. 24, 2019  (KR) ........................ 10-2019-0089737

(51) Int. Cl.
*B41K 3/64* (2006.01)
*F16M 11/12* (2006.01)
*F16M 11/18* (2006.01)

(52) U.S. Cl.
CPC ............. *B41K 3/64* (2013.01); *F16M 11/123* (2013.01); *F16M 11/18* (2013.01)

(58) Field of Classification Search
None
See application file for complete search history.

(56) References Cited

U.S. PATENT DOCUMENTS

| | | | |
|---|---|---|---|
| 2002/0150398 A1* | 10/2002 | Choi | G03F 7/70716 396/428 |
| 2009/0294059 A1* | 12/2009 | Choi | G03F 7/0002 156/714 |
| 2012/0168593 A1* | 7/2012 | Mekid | F16M 11/043 248/398 |

FOREIGN PATENT DOCUMENTS

| | | |
|---|---|---|
| JP | 2004-146601 A | 5/2004 |
| JP | 2009-200345 A | 9/2009 |

(Continued)

OTHER PUBLICATIONS

Machine translation of JP 2004146601A (Year: 2004).*
International Search Report PCT/ISA/210 for International Application No. PCT/KR2020/009503 dated Jul. 20, 2020.

*Primary Examiner* — Matthew G Marini
(74) *Attorney, Agent, or Firm* — Harness, Dickey & Pierce, P.L.C.

(57) ABSTRACT

In a leveling unit for imprinting and an imprint apparatus having the leveling unit, the leveling unit includes a base plate, a moving plate and a plurality of link parts. The moving plate is spaced apart from the base plate, and has a reference plane heading for an opposite direction of the base plate. The plurality of link parts connects the base plate with the moving plate, is spaced apart from each other by a predetermined distance along a circumferential direction with respect to a center of the reference plane, and is elastically and independently transformed by a pressing (Continued)

force applied to the reference plane to adjust an inclination of the moving plate.

12 Claims, 8 Drawing Sheets

(56) References Cited

FOREIGN PATENT DOCUMENTS

| | | |
|---|---|---|
| KR | 10-2005-0026088 A | 3/2005 |
| KR | 10-2008-0046475 A | 5/2008 |
| KR | 10-0843342 B1 | 7/2008 |
| KR | 10-2010-0133195 A | 12/2010 |
| KR | 10-1005584 B1 | 1/2011 |

* cited by examiner

LEVELING UNIT FOR IMPRINTING AND IMPRINT APPARATUS COMPRISING SAME

CROSS-REFERENCE TO RELATED APPLICATIONS

This application is a national phase under 35 U.S.C. § 371 of PCT International Application No. PCT/KR2020/009503 which has an International filing date of Jul. 20, 2020, which claims priority to KR Application No. 10-2019-0089737, filed Jul. 24, 2019, the entire contents of each of which are hereby incorporated by reference.

BACKGROUND

1. Field of Disclosure

The present disclosure of invention relates to a leveling unit for imprinting and an imprint apparatus having the leveling unit, and more specifically the present disclosure of invention relates to a leveling unit for imprinting and an imprint apparatus having the leveling unit capable of maintaining parallel between a wafer and a stamp.

2. Description of Related Technology

In a thermal imprint which is one of a nano imprint lithography technology and needs a relatively larger load, a stamp having a nano size is contacted with a polymer-coated wafer and then a pressure and a heat are applied, so that the polymer has liquidity to fill patterns between the stamp. Thus, a pattern is formed.

In contacting the stamp to the wafer, a leveling unit for imprinting to which the stamp is equipped is closely moved to a stage to which the wafer is equipped, and then the stamp is contacted with the wafer and the pressure is applied at the same time. Here, considering characteristics of a nano imprinting process, the wafer and the stamp should be maintained parallel with each other in contacting the stamp with the wafer, and the maintenance between the stamp and the wafer directly affects a yield of the imprinting.

Thus, for the maintenance between the stamp and the wafer, in the leveling unit for the imprinting, a mechanism for maintaining parallel between the stamp and the wafer should be equipped or applied.

As an example mechanism for the maintenance, an active mechanism and a passive mechanism may be considered. Here, the passive mechanism may be preferred since any additional actuator is unnecessary in the passive mechanism.

The passive mechanism may normally be performed by a mechanism using a flexure hinge, and may further be performed by an elastic link assembly having a spherical joint, a rotational join, a prismatic joint and so on.

However, most of the passive mechanism is operated by the joint having the flexure hinge. Here, an excessive stress may be applied to a specific flexure hinge and thus the specific flexure hinge may be damaged or fractured, when the load applied to each joint is not uniform.

Thus, the leveling unit for the imprinting having the mechanism capable of operating a horizontal reference plane to which the stamp is equipped smoothly, and preventing the mechanism from being damaged or fractured due to the excessive stress concentration, via dispersing the load applied to the flexure hinge and the link assembly uniformly, may be required to be developed.

Related prior art is Korean patent No. 10-1005584.

SUMMARY

The present invention is developed to solve the above-mentioned problems of the related arts. The present invention provides a leveling unit for imprinting, capable of operating a horizontal reference plane to which a stamp is equipped smoothly, preventing a mechanism from being damaged or fractured due to an excessive stress concentration, and maintaining parallel between a wafer and the stamp so that the wafer and the stamp are fully contacted with each other and are uniformly pressed with each other, via dispersing a load applied to a flexure hinge and a link assembly uniformly.

In addition, the present invention also provides an imprint apparatus having the leveling unit.

According to an example embodiment, a leveling unit includes a base plate, a moving plate and a plurality of link parts. The moving plate is spaced apart from the base plate, and has a reference plane heading for an opposite direction of the base plate. The plurality of link parts connects the base plate with the moving plate, is spaced apart from each other by a predetermined distance along a circumferential direction with respect to a center of the reference plane, and is elastically and independently transformed by a pressing force applied to the reference plane to adjust an inclination of the moving plate.

In an example, each of the link parts may include an elastic link part combined with the base plate and elastically transformed by the pressing force applied to the reference plane, and a link member connecting the elastic link with the moving plate, being combined with the elastic link with a rotational joint, and being combined with the moving plate with a spherical joint.

In an example, an extending line of the link member connecting the rotational joint with the spherical joint may be disposed to pass through the center of the reference plane.

In an example, the elastic link part may include a pair of elastic link parts spaced apart from each other along the circumferential direction, and the pair of elastic link parts may be independently combined with the link member with a rotational joint.

In an example, the elastic link part may include a first block combined with the base plate, a second block spaced apart from the first block and combined with the link member with a rotational joint, and an elastic member connecting the first block with the second block, and extending between the first block and the second block.

In an example, the first and second blocks may be spaced apart from each other along a horizontal direction, and the elastic member may be an elastic hinge extending along the horizontal direction.

In an example, at least two elastic hinges may be overlapped with each other and may be extended.

In an example, a plurality of the elastic members may be disposed with a predetermined distance along a vertical direction substantially perpendicular to the extending direction of the elastic member.

In an example, a thickness of the elastic member may increase towards an end of the elastic member at which the first and second blocks are connected.

According to another example embodiment, an imprint apparatus includes a stage in which a stamp or a wafer is disposed, the leveling unit in which the wafer or the stamp is disposed, and a driving part configured to press the base plate toward the stage. The wafer and the stamp are uniformly contacted with each other with maintaining parallel between the wafer and the stamp, when the wafer and the stamp are contacted with each other.

In an example, the imprint apparatus may further include a driving platform connecting the base plate with the driving part, and a load sensor disposed between the driving platform and the base plate, and measuring a pressure applied from the driving platform to the base plate.

In an example, a plurality of the load sensors may be spaced apart from each other by a predetermined distance along the circumferential direction, and each of the load sensors may be disposed between the link parts adjacent to each other not to be overlapped with the link part.

In an example, the imprint apparatus may further include a moving platform combined with the moving plate and interlocked with the moving plate. The stamp or the wafer may be disposed on the moving platform.

In an example, the wafer may be disposed on the stage and the stamp may be disposed on the moving platform, or the stamp may be disposed on the stage and the wafer may be disposed on the moving platform.

According to the present example embodiments, when the wafer and the stamp is not parallel with each other, the wafer and the stamp are partially contacted with each other and promptly become parallel with each other to be entirely contacted with each other, using the plurality of link parts. Thus, the pressure is uniformly applied with an entire contact state, and an yield of the imprint process may be enhanced.

In addition, the mechanism may be simplified. The load applied to the link assembly may be uniformly dispersed to drive the horizontal reference plane in which the stamp is equipped smoothly. Thus, the mechanism may be prevented from being damaged or fractured due to the excessive stress concentration.

In addition, one of the wafer W and the stamp S may be positioned on the moving plate a level of which is adjusted by the leveling unit, and thus the imprint process may be performed with adjusting the level of the stamp over the wafer, or with adjusting the level of the wafer under the stamp. Thus, the imprint apparatus may be variously designed or selected considering the characteristics of the process, and the process efficiency and diversification of design may be increased.

REFERENCE NUMERALS

Figure 1A:
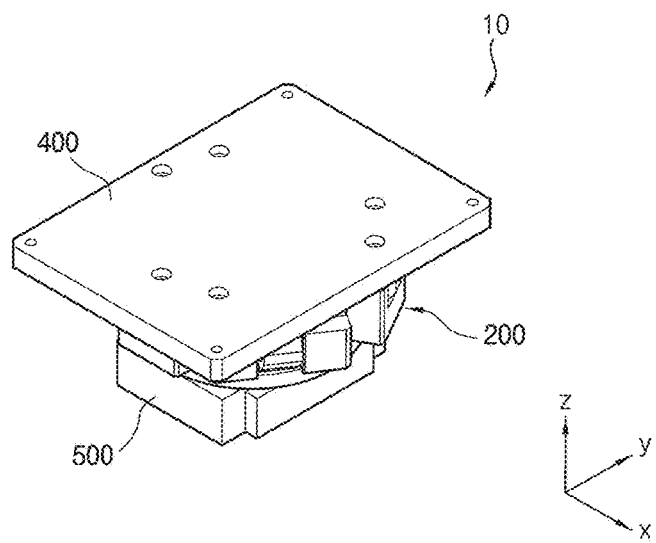
FIG. 1A and FIG. 1B are perspective views illustrating an imprint apparatus according to an example embodiment of the present invention.

| 10, 20: imprint apparatus | 100, 101: stage |
|---|---|
| 200, 201: leveling unit for imprinting | |
| 210, 211: base plate | 230, 240: moving plate |
| 250, 280: link part | 260, 281: elastic link part |
| 270, 290: link member | 300, 301: driving part |

DETAILED DESCRIPTION

The invention is described more fully hereinafter with Reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

Figure 1B:
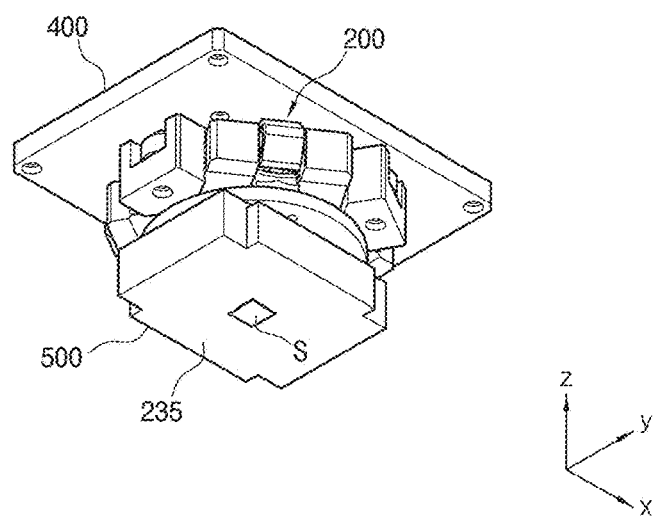
Figure 2:
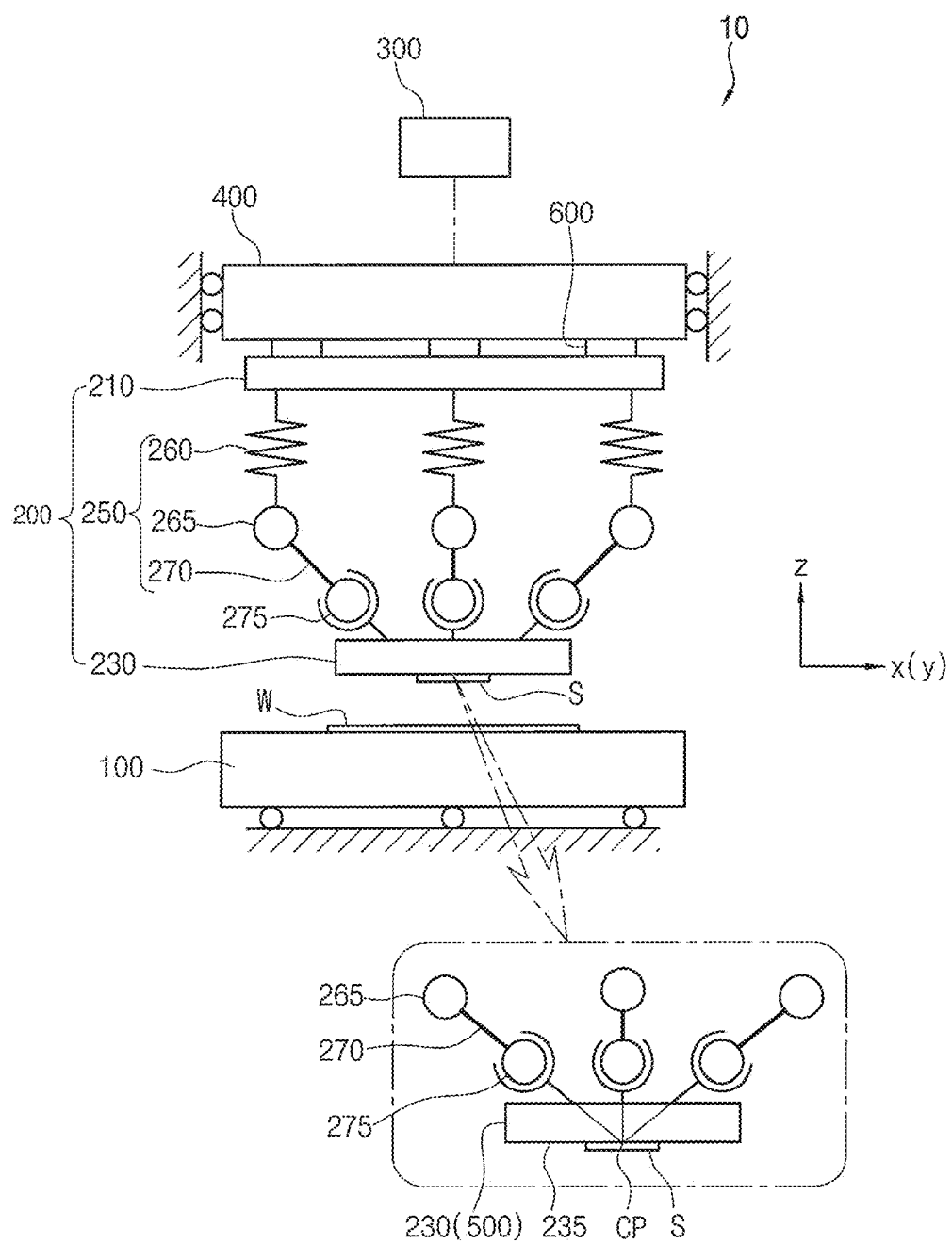
FIG. 2 is a conceptual view illustrating the imprint apparatus of FIG. 1.
Figure 3:
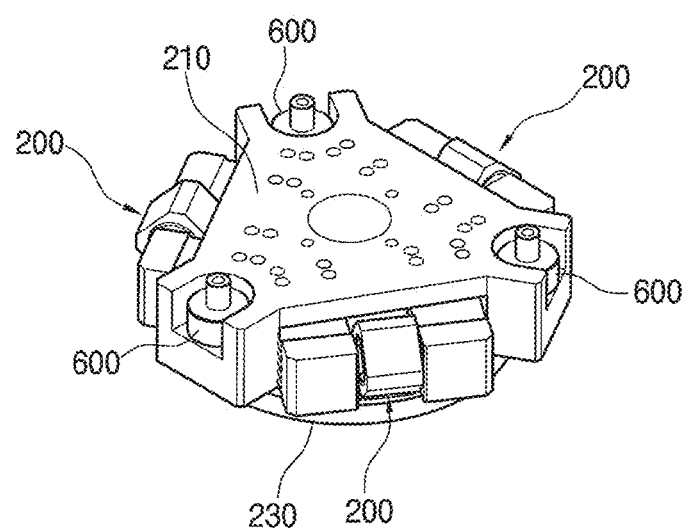
FIG. 3 is a perspective view illustrating a leveling unit for imprinting of FIG. 2.
Figure 4:
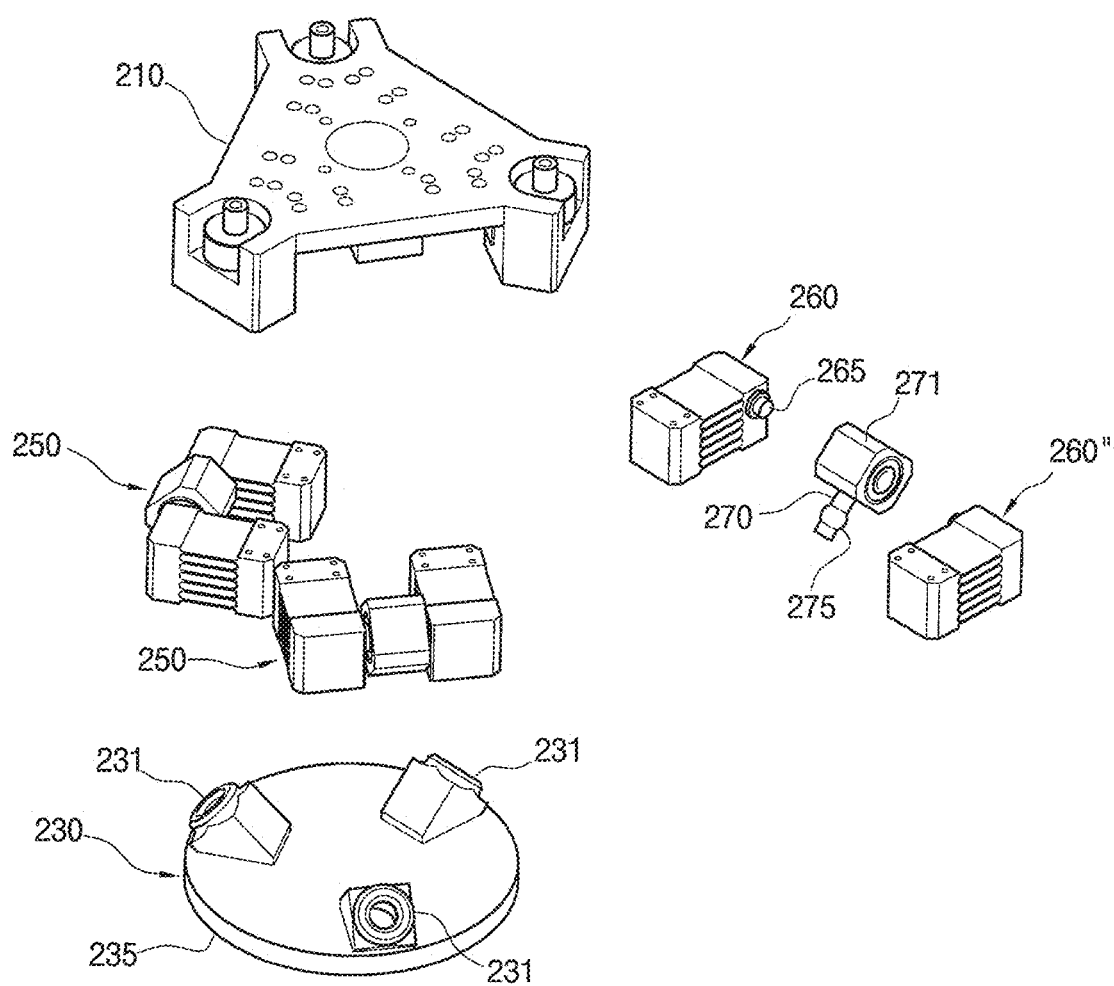
FIG. 4 is an exploded perspective view illustrating the leveling unit for imprinting of FIG. 3.

FIG. 1A and FIG. 1B are perspective views illustrating an imprint apparatus according to an example embodiment of the present invention. FIG. 2 is a conceptual view illustrating the imprint apparatus of FIG. 1. FIG. 3 is a perspective view illustrating a leveling unit for imprinting of FIG. 2. FIG. 4 is an exploded perspective view illustrating the leveling unit for imprinting of FIG. 3.

Referring to FIG. 1 to FIG. 4, the imprint apparatus 10 according to the present example embodiment includes a stage 100, a leveling unit for imprinting 200 and a driving part 300.

A wafer W required to be imprinted is disposed on the stage 100. The wafer W may have a planar shape with a predetermined area. The wafer W may be disposed at a center of the stage 100 but not limited thereto and the wafer W may be disposed at any position on the stage 100.

The stage 100 moves in a plane (X-Y plane) formed by a first direction X and a second direction Y perpendicular to the first direction X.

Here, the leveling unit for imprinting (200, hereinafter the leveling unit) may move in the X-Y plane, and may also move along a third direction Z perpendicular to the first and second directions X and Y.

A driver moving the stage 100 may include a conventional linear moving structure such as a linear motor, a rotational motor combined with a ball screw and so on, and any additional explanation concerning the driver is omitted.

The leveling unit 200 is disposed over the stage 100, which means that the leveling unit 200 is spaced apart from the stage 100 along the third direction Z. That is, the leveling unit 200 is disposed at an upper side of the stage 100.

A position of a stamp S which is disposed or equipped on the leveling unit 200 is adjusted or controlled to be parallel with the wafer W on the stage 100, and thus the stamp S makes contact with the wafer W with a uniform pressure over the entire area of the wafer W during the imprinting.

The driving part 300 pressurizes the leveling unit 200 toward the stage 100 along the third direction Z. As the leveling unit 200 is pressurized toward the stage 100, the stamp S makes contact with the wafer W and the imprinting is performed.

The leveling unit 200 includes a base plate 210, a moving plate 230 and a link part 250.

The base plate 210 is connected to the driving part 300, and moves along the third direction Z according to an operation of the driving part 300. The link part 250 is combined with a lower surface of the base plate 210.

The imprint apparatus 10 may further include a driving platform 400. The driving platform 400 is disposed between the base plate 210 and the driving part 300. As the operation of the driving part 300, the driving platform 400 moves along the third direction Z and thus the driving platform 400 moves the base plate 210 along the third direction Z.

Here, a load sensor 600 is disposed between the driving platform 400 and the base plate 210. The load sensor 600 measures a pressing force applied from the driving platform 400 to the base plate 210. A plurality of the load sensors 600 may be disposed along a circumferential direction with respect to a center of the base plate 210. In addition, the plurality of the load sensors 600 may be spaced apart from each other by a predetermined distance.

When the load sensor 600 is disposed as a plural, each of the load sensors 600 is disposed between the link parts 250 adjacent to each other in a plane, so that each load sensor dose not overlap with each link part 250.

Accordingly, a load distribution along the circumferential direction of the base plate 210 may be effectively obtained using the plurality of load sensors 600 disposed along the circumferential direction of the base plate 600. For example, each of the load sensors 600 may be a load cell.

The moving plate 230 is spaced apart from the base plate 210 along the third direction Z toward the stage 100. The moving plate 230 is disposed between the base plate 210 and the stage 100.

A reference plane 235 is formed on a lower surface of the moving pate 230 heading for the stage 100. The reference plane 235 is maintained to be parallel with the stage 100, and the stamp S is equipped or disposed on a center of a lower surface of the reference plane 235.

A spherical joint housing 231 is disposed on an upper surface of the moving plate 230, and a spherical joint 275 of a link member 270 mentioned below is combined with the spherical joint housing 231.

The imprint apparatus 10 may further include a moving platform 500. The moving platform 500 is combined with the lower surface of the moving plate 230, and is interlocked with the moving plate 230. When the moving platform 500 is configured, the stamp S may be disposed on a lower surface of the moving platform 500, and thus the lower surface of the moving platform 500 may be the reference plane 235.

Various kinds of sizes or shapes of the moving platform 500 may be selectively used according to the kinds or the processes of the wafer W and the stamp S for the imprinting.

The link part 250 connects the base plate 210 with the moving plate 230. A plurality of the link parts 250 may be disposed along a circumferential direction with respect to a central point CP of the reference plane 235, by a predetermined distance. In the present example embodiment, three link parts 250 may be disposed by the predetermined angle of 120°, but not limited thereto. Thus, two link parts, or four or more link parts may be disposed.

The plurality of link parts 250 is independently and elastically transformed by the pressing force applied to the reference plane 235, and thus controls or adjusts an inclination of the moving plate 230 having the reference plane 235.

That is, the plurality of the link parts 250 is independently and elastically transformed by the pressing force applied to the moving plate 230 from the wafer W and the stage 100, to control or adjust the inclination of the moving plate 230. The link parts 250 control or adjust the inclination of the stamp S to maintain the stamp S on the reference plane 235 parallel with the wafer W on the stage 100, and thus the wafer W may be completely contacted with the stamp S.

Each of the link parts 250 has the same configuration and structure, and thus hereinafter single link part 250 is explained in detail.

Figure 5A:
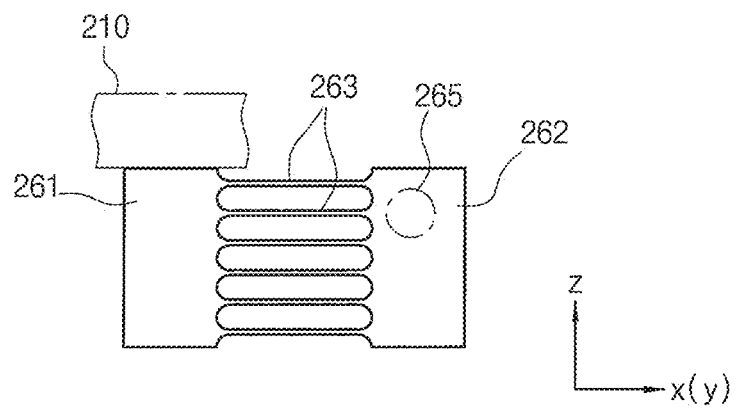
FIG. 5A, FIG. 5B and FIG. 5C are side views illustrating a configuration and an operating state of an elastic link part of FIG. 3.
Figure 5B:
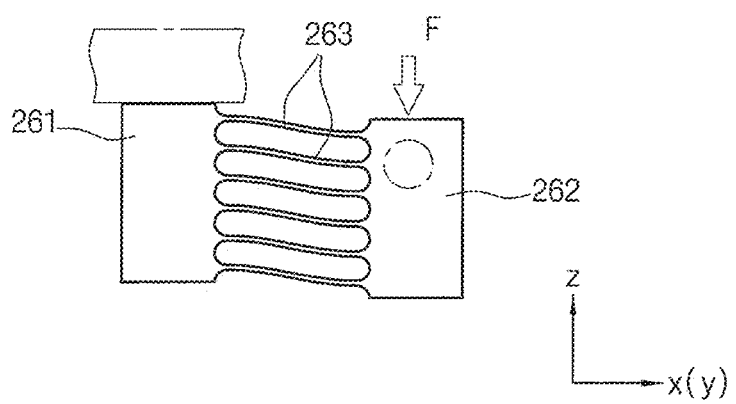
Figure 5C:
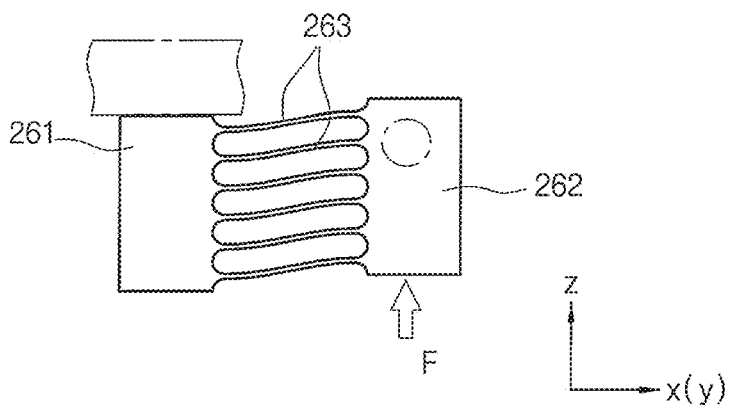

FIG. 5A, FIG. 5B and FIG. 5C are side views illustrating a configuration and an operating state of an elastic link part of FIG. 3.

Referring to FIG. 5A, FIG. 5B and FIG. 5C, the link part 250 includes an elastic link part 260 and a link member 270.

The elastic link part 260 is combined with the base plate 210, and is elastically transformed due to the pressing force applied to the reference plane 235 of the moving plate 230 along the third direction Z. In the present example embodiment, the elastic link part 260 includes a first block 261, a second block 262 and an elastic member 263.

An upper surface of the first block 261 is fixed to and combined with a lower surface of the base plate 210.

The second block 262 is spaced apart from the first block 261, along the first direction X or the second direction Y. A first side surface of the second block 262 is combined with the link member 270 with a rotational joint 265, and the rotational joint 265 is disposed at the first side surface of the second block 262.

The elastic member 263 connects the first block 261 with the second block 262, and the elastic member 263 may be elongated or contracted along the third direction Z by an external force applied from the first block 261 and the second block 262. That is, the first and second blocks 261 and 262 may perform a relative-translational movement long the third direction Z.

The elastic member 263 may include an elastic hinge extending along the first direction X or the second direction Y. In the present example embodiment, the elastic member 263 is a plural more than two, and thus the elastic members 263 overlap with each other along the third direction Z by a predetermined distance.

Alternatively, the elastic member 263 may be a leaf shape spring, or may be formed in various kinds of shapes according to the shape of a notch portion.

The distance between the elastic members 263 and the number of the elastic members 263 may be variously changed or selected. For example, when a relatively high elastic restoring force is necessary, the distance between the elastic members 263 may be decreased and the number of the elastic members 263 may be increased. Alternatively, when a relatively low elastic restoring force is necessary, the distance between the elastic members 263 may be increased and the number of the elastic members 263 may be decreased.

In addition, a thickness of the elastic member 263 along the third direction Z may also be selectively changed. For example, when a relatively high elastic restoring force is necessary, the thickness between the elastic members 263 may be increased. Alternatively, when a relatively low elastic restoring force is necessary, the thickness between the elastic members 263 may be decreased.

In addition, the plurality of the elastic members 263 may have the thickness different from each other along the third direction ZS.

Accordingly, the distance, the number and the thickness of the elastic members 263 may be variously changed according to a kind of the wafer W and the stamp S or a process of the imprinting.

In the present example embodiment, the elastic member 263 having the leaf spring shape performs the first and second blocks 261 and 262 to have the translational movement along the third direction Z, by the connecting structure with the first and second blocks 261 and 262 like a four bar link. Here, during the elastic transformation of the elastic member 263, the first and second blocks 261 and 262 may have a fine curved path in the translational movement along the third direction Z.

However, since a maximum parallel error between the stamp S and the wafer W is less than about 1 mm in the nano imprint process performed in a relatively high load circumstance over about 1,000N, the first and second blocks 261 and 262 connected with the elastic member 263 substantially performs the translational movement along the third direction Z in the above fine range of the nano imprint process.

In addition, a stress may be concentrated at both ends of the elastic member 263 connected to the first and second blocks 261 and 262 when the external force is applied. Thus, the thickness of the elastic member 263 is increased toward the both ends of the elastic member 263 connected to the first and second blocks 261 and 262. As illustrated in the figure, both ends of the elastic member 263 connected to the first and second blocks 261 and 262 may be fillet machined to have the thickness larger than other portion of the elastic member 263.

Thus, the stress concentrated to both ends of the elastic member is effectively distributed, so that the elastic transformation may be uniformly and effectively performed in an entire area of elastic member 263 having a predetermined length along the first direction X or the second direction Y.

The first block 261, the second block 262 and the elastic member 263 may be integrally formed with the same material. For example, a single block having the first block 262, the second block 262 and the elastic member 263 integrally is manufactured first, and then a punching process may be performed at the distance between the elastic members 263 to form the elastic members 263.

Referring to FIG. 4 again, the elastic link part 260 includes a pair of elastic link parts 260 and 260" spaced apart from each other along the circumferential direction. The pair of link parts 260 and 260" is disposed at both sides of the link member 270 along the circumferential direction. The pair of link parts 260 and 260" is independently combined with the link member 270 with the rotational join 265. Thus, the pair of link parts 260 and 260" may effectively distribute the load transmitted from the single link member 270.

The link member 270 connects the elastic link part 260 with the moving plate 230. A first end of the link member 270 is combined with the second block 262 of the elastic link part 260 with the rotational joint 265, and a second end of the link member 270 is combined with the moving plate 230 with the spherical joint 275.

A rotational joint housing 271 may be configured at an upper side of the link member 270 to be combined with the rotational joint 265 of the second block 262. In the present example embodiment, when the pair of link parts 260 and 260" is configured to be connected to the single link member 270, a pair of rotational joint housing 271 may be configured at the link member 270 to correspond to the pair of link parts 260 and 260".

In addition, the spherical joint 275 is configured at a lower portion of the link member 270. The spherical joint 275 is combined with the spherical joint housing 231 disposed on the upper surface of the moving plate 230. The link member 270 rotates along the moving plate 230 with respect to a center of the spherical joint 275.

Referring to FIG. 2 again, the link member 270 extends in a straight line heading from the rotational joint 265 to the spherical joint 275. An extending line of the link member 270 connecting the rotational joint 265 to the spherical joint 275 passes through the central point CP of the reference plane 235 on which the stamp S is disposed.

Accordingly, the plurality of the link members 270 combined with the moving plate 230 with the spherical joint 275 is interlocked and constrained with each other by an imaginary central point CP on the reference plane 235.

Figure 6A:
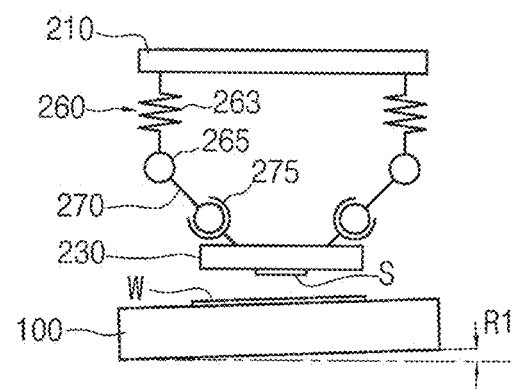
FIG. 6A, FIG. 6B and FIG. 6C are operating views illustrating an operation of the imprint apparatus of FIG. 1.
Figure 6B:
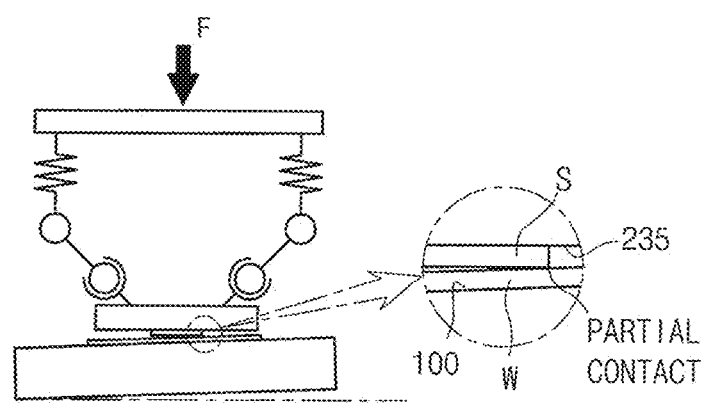
Figure 6C:
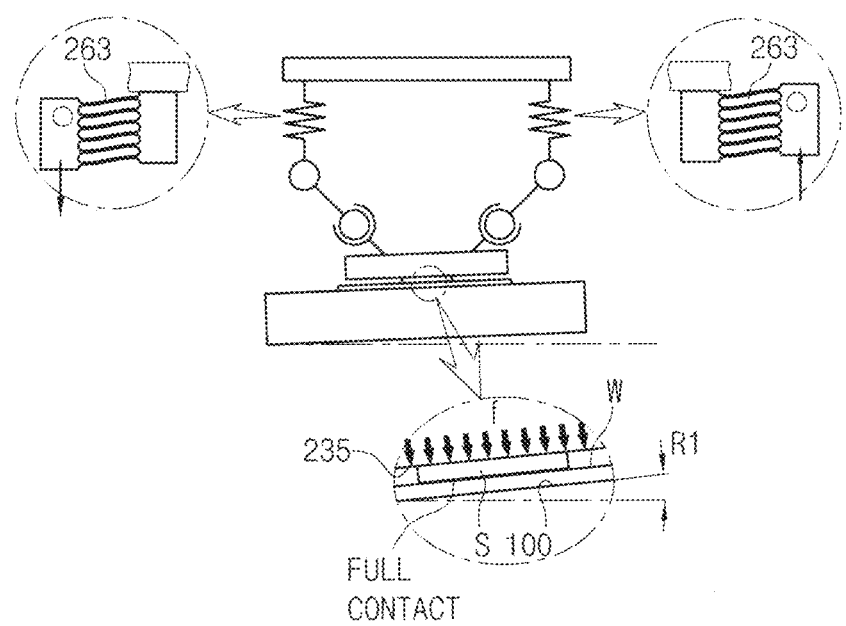

FIG. 6A, FIG. 6B and FIG. 6C are operating views illustrating an operation of the imprint apparatus of FIG. 1. For the convenience of the explanation, the operating views of FIG. 6A, FIG. 6B and FIG. 6C are illustrated in two dimension using two link parts.

Referring to FIG. 6A, FIG. 6B and FIG. 6C, the operating process of the imprint apparatus 10 according to the present example embodiment is as follows.

First, referring to FIG. 6A and FIG. 6B, the wafer W is disposed on the stage 100 and the stamp S is disposed on the leveling unit 200, and then the base plate 210 moves along the third direction Z according to an operation of the driving part 300. Then, the moving plate 230 which is connected to the base plate 210 by the link part 250 is interlocked and moves along the third direction Z, too. Thus, the stamp S equipped on the reference plane 235 of the moving plate 230 moves toward the wafer W along the third direction Z.

Here, as illustrated in the figure, the wafer W disposed on the stage 100 may have an inclination angle R1 having an angle with respect to a horizontal line. When the moving plate 230 moves continuously with the inclined state of the wafer W, as illustrated in FIG. 6A, a portion of the wafer W or a portion of the stage 100 deviated from the center of the stage 100 contacts first with the moving plate 230 or the stamp S.

In addition, the leveling unit 200 is pressed continuously along the third direction Z by the driving part 300 with the wafer W and the stage 100 partially contacted with the stamp S and the moving plate 230, the inclination of the moving plate 230 is controlled or adjusted to be parallel with the stage 100, via the translational movement of the spherical joint 275, the rotational joint 265 and the elastic member 263 of both link parts 250, as illustrated in FIG. 6C. Then, the wafer W and the stamp S form parallel with each other, and fully make contact with each other.

In addition, the leveling unit 200 is further pressed along the third direction Z for the imprint, the second block 262 performs an upwardly translational movement in the link 250 disposed close to a partial contact area, which is a right area as illustrated in FIG. 6B, due to an upwardly pressing force applied to the second block 262 through the link member 270. Thus, the elastically transformed right elastic member 263 in FIG. 6C generates a stiffness.

Here, the extending line of the right link member 270 and the extending line of the left link member 270 in FIG. 6A are constrained to the reference plane 235 on which the stamp S is equipped, so that the right and left link members 270 are interlocked and moved together.

Thus, the second block 262 performs a downwardly translational movement due to a downwardly pressing force applied to the second block 262 through the link member 270, in the link part 250 disposed at a left area as illustrated in FIG. 6B. Thus, the left elastic member 263 in FIG. 6C also generates the stiffness.

Accordingly, the right elastic member 263 and the left elastic member 262 respectively transformed with the directions opposite to each other, generate the same stiffness, and thus, as illustrated in FIG. 6C, the wafer W and the stamp S are fully contacted with each other, and the wafer W and the stamp S are continuously contacted with each other with the uniform pressure.

With the full contact between the wafer W and the stamp S, the size of the pressure and the quantity of the uniform pressure applied to the contact area between the wafer W and the stamp S may be monitored in a real time using the load sensor 600.

Figure 7:
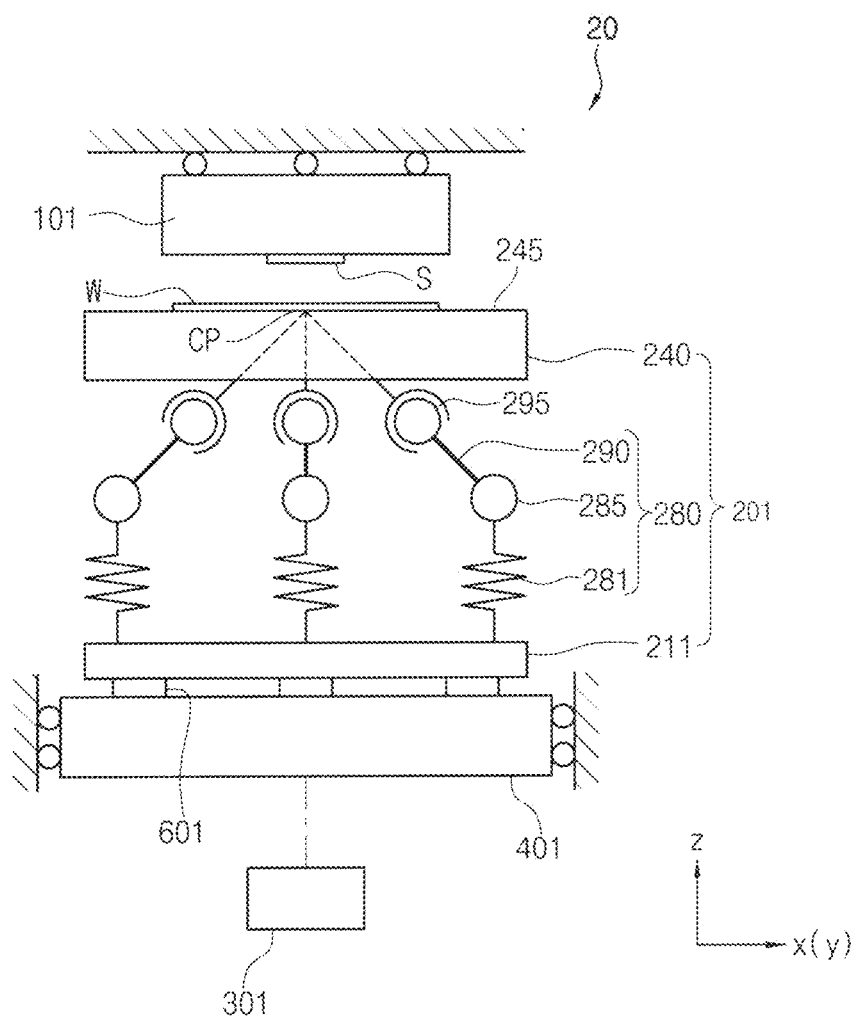
FIG. 7 is a conceptual view illustrating an imprint apparatus according to another example embodiment of the present invention.

FIG. 7 is a conceptual view illustrating an imprint apparatus according to another example embodiment of the present invention.

The imprint apparatus 20 according to the present example embodiment is substantially same as the imprint apparatus 10 according to the previous example embodiment, except that a leveling unit 201 controls a position of the moving plate 240 on which the wafer W is disposed, and thus same reference numerals are used for the same elements and any repetitive explanation will be omitted.

Referring to FIG. 7, in the imprint apparatus 20 according to the present example embodiment, the stamp S is disposed on the stage 101 moving in the X-Y plane and the wafer W is disposed on the moving plate 240. The posture of the moving plate 240 is controlled or adjusted by the leveling unit 201.

Thus, the position or the posture of the wafer W with respect to the stamp S is controlled or adjusted by the leveling unit 201. The control or adjusting mechanism in the present example embodiment is opposite to that in the previous example embodiment in which the position or the posture of the stamp S with respect to the wafer W is controlled or adjusted by the leveling unit 200.

In the present example embodiment, the stamp S performing the imprint is disposed on the stage 101, and the stamp S may be disposed at a center of the stage 101 but not limited thereto.

Here, the stamp S is disposed on a lower surface of the stage 101.

The stage 101 moves in the X-Y plane, and the driving part moving the stage 101 is the same as explained above.

The leveling unit 201 is spaced apart from the stage 101 along the third direction Z, and the leveling unit 201 is disposed under the stage 101.

The wafer W is equipped on the leveling unit 201. The leveling unit 201 controls or adjusts the posture thereof to maintain the wafer W on the leveling unit 201 parallel with the stamp S on the stage 101. In addition, the leveling unit 201 makes the wafer W and the stamp S to make contact with each other with a uniform pressure over the entire area of the wafer W in the imprint.

The leveling unit 201 includes a base plate 211, a moving plate 240 and a link part 280.

The base plate 211 is connected to a driving part 301 and moves along the third direction Z according to an operation of the driving part 301. The link part 280 is combined on an upper surface of the base plate 211.

The driving part 301 pressurizes the leveling unit 201 toward the moving plate 240 along the third direction Z. As the leveling unit 201 is pressurized toward the stage 100, the stamp S makes contact with the wafer W and the imprint is performed.

Here, a driving platform 401 is further configured to the imprint apparatus. The driving platform 401 is disposed between the base plate 211 and the driving part 301. According to the operation of the driving part 301, the base plate 211 moves along the third direction Z.

Here, the load sensor 601 may be disposed between the driving platform 401 and the base plate 211, and the disposition and the operation of the load sensor 601 are substantially same as those of the load sensor 600 mentioned above and thus any repetitive explanation will be omitted.

The moving plate 240 is spaced apart from the base plate 211 along the third direction Z, and thus the moving plate 240 is disposed between the base plate 211 and the stage 101.

The wafer W is equipped on an upper surface of the moving plate 240, and the reference plane 245 is formed on the upper surface of the moving plate 240 heading for the stage 101. The reference plane 245 maintains parallel with the stage 101, and the wafer W is disposed on a center of an upper surface of the reference plane 245.

In addition, the spherical joint housing (not shown) is disposed on a lower surface of the moving plate 240, and the spherical joint 295 of the link member 290 is combined with the spherical joint housing.

The imprint apparatus 20 may further include a moving platform. The combination between the moving platform and the moving plate 240 and the interlocking therebetween are the same as explained above in the previous example embodiment.

The link part 280 connects the base plate 211 with the moving plate 240, and a plurality of the link parts 280 is spaced apart from each other along the circumferential direction with respect to the central point CP of the reference plane 245 by a predetermined distance. In the present example embodiment, three link parts 280 may be configured with a distance of an angle of 120°, but not limited thereto, and two link parts, or four or more link parts may be configured.

The plurality of link parts is independently and elastically transformed by the pressing force applied to the reference plane 245, and thus the inclination of the moving plate 240 having the reference plane 245 may be controlled or adjusted.

Due to the pressing force applied to the moving plate 240 from the stamp S and the stage 101, the plurality of the link parts 280 is independently and elastically transformed to control or adjust the inclination of the moving plate 240. The inclination of the wafer W is controlled or adjusted to maintain the stamp S on the stage 101 and the wafer W on the reference plane 245 parallel with each other, and thus the wafer W and the stamp S are fully contacted with each other.

Each of the plurality of the link parts 280 has the same structure, as explained above, and the detailed structure and operation of each of an elastic link part 281, a rotational joint 285 and a link member 290 in the link part 280, and a spherical joint 295 of the link member 290 are substantially same as those of each of the elastic link part 260, the rotational joint 265 and the link member 270 in the link part 250, and the spherical joint 275 of the link member 270, and thus any additional explanation will be omitted.

Accordingly, in the present example embodiment, the leveling unit 20 controls the position and the posture of the moving plate 240 on which the wafer W is equipped, with respect to the stage 101 on which the stamp S is equipped. Thus, the posture of the stamp and the posture of the wafer are selectively controlled, and design flexibility may be more enhanced.

According to the present example embodiment, when the wafer and the stamp is not parallel with each other, the wafer and the stamp are partially contacted with each other and promptly become parallel with each other to be entirely contacted with each other, using the plurality of link parts.

Thus, the pressure is uniformly applied with an entire contact state, and an yield of the imprint process may be enhanced.

In addition, the mechanism may be simplified. The load applied to the link assembly may be uniformly dispersed to drive the horizontal reference plane in which the stamp is equipped smoothly. Thus, the mechanism may be prevented from being damaged or fractured due to the excessive stress concentration.

In addition, one of the wafer W and the stamp S may be positioned on the moving plate a level of which is adjusted by the leveling unit, and thus the imprint process may be performed with adjusting the level of the stamp over the wafer, or with adjusting the level of the wafer under the stamp. Thus, the imprint apparatus may be variously designed or selected considering the characteristics of the process, and the process efficiency and diversification of design may be increased.

Accordingly, the imprint apparatus according to the present example embodiments may be effectively used in the thermal imprint process in which a relatively larger load over about 1,000N is applied.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A leveling unit for imprinting, the leveling unit comprising:
   a base plate;
   a moving plate spaced apart from the base plate, and having a reference plane heading for an opposite direction of the base plate; and
   a plurality of link parts connecting the base plate with the moving plate, being spaced apart from each other by a predetermined distance along a circumferential direction with respect to a center of the reference plane, and configured to be elastically and independently transformed by a pressing force applied to the reference plane to adjust an inclination of the moving plate,
   wherein each of the link parts comprises,
      an elastic link part combined with the base plate and elastically transformed by the pressing force applied to the reference plane, and
      a link member connecting the elastic link part with the moving plate, being combined with the elastic link part with a rotational joint, and being combined with the moving plate with a spherical joint,
   wherein the elastic link part comprises first and second blocks spaced apart from each other and an elastic member between the first and second blocks, and
   wherein the first block is combined with the base plate, the second block is combined with the link member with the rotational joint, and
   the elastic member is configured to connect the first block with the second block and extends between the first block and the second block.

2. The leveling unit of claim 1, wherein an extending line of the link member connecting the rotational joint with the spherical joint passes through the center of the reference plane.

3. The leveling unit of claim 1, wherein the elastic link part comprises a pair of elastic link parts spaced apart from each other along the circumferential direction, and the pair of elastic link parts is independently combined with the link member with the rotational joint.

4. The leveling unit of claim 1, wherein the first and second blocks are spaced apart from each other along a horizontal direction, and the elastic member is an elastic hinge extending along the horizontal direction.

5. The leveling unit of claim 4, wherein at least two elastic hinges are overlapped with each other and are extended.

6. The leveling unit of claim 4, wherein a plurality of the elastic members is disposed with a distance along a vertical direction substantially perpendicular to an extending direction of the elastic member.

7. The leveling unit of claim 1, wherein a thickness of the elastic member increases towards an end of the elastic member at which the first and second blocks are connected.

8. An imprint apparatus comprising:
   a stage in which a stamp or a wafer is disposed;
   the leveling unit of claim 1 in which the wafer or the stamp is disposed; and
   a driving part configured to press the base plate toward the stage,
   wherein the wafer and the stamp are uniformly contacted with each other with maintaining parallel between the wafer and the stamp, when the wafer and the stamp are contacted with each other.

9. The imprint apparatus of claim 8, further comprising:
   a driving platform connecting the base plate with the driving part; and
   a load sensor between the driving platform and the base plate, and measuring a pressure applied from the driving platform to the base plate.

10. The imprint apparatus of claim 9, wherein the load sensor includes a plurality of load sensors that are spaced apart from each other by a distance along the circumferential direction, and each of the load sensors is between the link parts adjacent to each other not to overlap the link parts.

11. The imprint apparatus of claim 8, further comprising:
    a moving platform combined with the moving plate and interlocked with the moving plate,
    wherein the stamp or the wafer is on the moving platform.

12. The imprint apparatus of claim 11, wherein the wafer is on the stage and the stamp is on the moving platform, or the stamp is on the stage and the wafer is on the moving platform.

* * * * *